United States Patent
Conner (10) Patent No.: US 7,709,811 B2
(45) Date of Patent: May 4, 2010

(54) LIGHT EMITTING DIODE ILLUMINATION SYSTEM

(76) Inventor: Arlie R. Conner, 7624 SE. 7th Ave., Portland, OR (US) 97202

( * ) Notice: Subject to any disclaimer, the term of this patent is extended or adjusted under 35 U.S.C. 154(b) by 0 days.

(21) Appl. No.: 12/167,071

(22) Filed: Jul. 2, 2008

(65) Prior Publication Data

US 2009/0008573 A1    Jan. 8, 2009

Related U.S. Application Data (60) Provisional application No. 60/947,938, filed on Jul. 3, 2007.

(51) Int. Cl.
*F21V 9/16* (2006.01)
(52) U.S. Cl. .................. 250/459.1; 313/483; 362/84; 362/231; 362/235
(58) Field of Classification Search .............. 250/459.1, 250/216; 313/483; 362/235, 84, 231
See application file for complete search history.

(56) References Cited

U.S. PATENT DOCUMENTS

| | | | |
|---|---|---|---|
| 1,998,054 A | 4/1935 | McBurney |
| 3,313,337 A | 4/1967 | Bernat |
| 3,637,285 A | 1/1972 | Stewart |
| 3,759,604 A | 9/1973 | Thelen |
| 3,881,800 A | 5/1975 | Friesem |
| 3,982,151 A | 9/1976 | Ludovici |
| 4,003,080 A | 1/1977 | Maiman |
| 4,298,820 A | 11/1981 | Bongers |
| 4,371,897 A | 2/1983 | Kramer |
| 4,510,555 A | 4/1985 | Mori |
| 4,539,687 A | 9/1985 | Gordon |
| 4,626,068 A | 12/1986 | Caldwell |
| 4,642,695 A | 2/1987 | Iwasaki |
| 4,644,141 A | 2/1987 | Hagen |
| 4,695,332 A | 9/1987 | Gordon |
| 4,695,732 A | 9/1987 | Ward |
| 4,695,762 A | 9/1987 | Berkstresser |
| 4,713,577 A | 12/1987 | Gualtieri |

(Continued)

FOREIGN PATENT DOCUMENTS

CA    2 280 398    4/2000

(Continued)

OTHER PUBLICATIONS

International Search Report dated Jan. 30, 2009, Application No. PCT/US2008/069214, 4 pages.

(Continued)

*Primary Examiner*—David P Porta
*Assistant Examiner*—Djura Malevic
(74) *Attorney, Agent, or Firm*—Fliesler Meyer LLP (57) ABSTRACT

In various embodiments of the invention, a unique construction for Light Emitting Diodes (LEDs) with prisms and dyes and other optical elements can be used to generate a variety of light sources with different emission spectra. In an embodiment of the invention, reflected light can be redirected outward. In another embodiment of the invention, a white LED based light uses a blue LED and associated optics elements, including a high index glass prism or rod, a layer of dyed florescent polymer and an extraction-enhancing optical element or lens, such that all of the light emitted from with the dye layer can be directed outward.

21 Claims, 9 Drawing Sheets

U.S. PATENT DOCUMENTS

| | | | |
|---|---|---|---|
| 4,724,356 | A | 2/1988 | Daehler |
| 4,798,994 | A | 1/1989 | Rijpers |
| 4,852,985 | A | 8/1989 | Fujihara et al. |
| 4,937,661 | A | 6/1990 | Van Der Voort |
| 4,995,043 | A | 2/1991 | Kuwata |
| 5,052,016 | A | 9/1991 | Mahbobzadeh |
| 5,089,860 | A | 2/1992 | Deppe |
| 5,109,463 | A | 4/1992 | Lee |
| 5,126,626 | A | 6/1992 | Iwasaki |
| 5,128,846 | A | 7/1992 | Mills et al. |
| 5,137,598 | A | 8/1992 | Thomas |
| 5,193,015 | A | 3/1993 | Shanks |
| 5,200,861 | A | 4/1993 | Moskovich |
| 5,226,053 | A | 7/1993 | Cho |
| 5,231,533 | A * | 7/1993 | Gonokami et al. .......... 359/328 |
| 5,233,372 | A | 8/1993 | Matsumoto |
| 5,249,195 | A | 9/1993 | Feldman |
| 5,285,131 | A | 2/1994 | Muller |
| 5,289,018 | A | 2/1994 | Okuda |
| 5,312,535 | A | 5/1994 | Waska |
| 5,315,128 | A | 5/1994 | Hunt |
| 5,332,892 | A | 7/1994 | Li et al. |
| 5,345,333 | A | 9/1994 | Greenberg |
| 5,363,398 | A | 11/1994 | Glass |
| 5,416,342 | A | 5/1995 | Edmond et al. |
| 5,416,617 | A | 5/1995 | Loiseaux |
| 5,418,584 | A | 5/1995 | Larson |
| 5,428,476 | A | 6/1995 | Jensen |
| 5,469,018 | A | 11/1995 | Jacobsen |
| 5,475,281 | A | 12/1995 | Heijboer |
| 5,478,658 | A | 12/1995 | Dodabalapur |
| 5,493,177 | A | 2/1996 | Muller |
| 5,500,569 | A | 3/1996 | Blomberg |
| 5,542,016 | A | 7/1996 | Kaschke |
| 5,616,986 | A | 4/1997 | Jacobsen |
| 5,644,676 | A | 7/1997 | Blomberg |
| 5,658,976 | A | 8/1997 | Carpenter |
| 5,669,692 | A | 9/1997 | Thorgersen |
| 5,671,050 | A | 9/1997 | De Groot |
| 5,674,698 | A | 10/1997 | Zarling |
| 5,715,083 | A | 2/1998 | Takayama |
| 5,757,014 | A | 5/1998 | Bruno |
| 5,781,338 | A | 7/1998 | Kapitza et al. |
| 5,804,919 | A | 9/1998 | Jacobsen |
| 5,808,759 | A | 9/1998 | Okamori et al. |
| 5,827,438 | A | 10/1998 | Blomberg |
| 5,833,827 | A | 11/1998 | Anazawa |
| 5,858,562 | A | 1/1999 | Utsugi |
| 5,864,426 | A | 1/1999 | Songer |
| 5,942,319 | A | 8/1999 | Oyama |
| 5,955,839 | A | 9/1999 | Jaffe |
| 6,154,282 | A | 11/2000 | Lilge et al. |
| 6,198,211 | B1 | 3/2001 | Jaffe |
| 6,204,971 | B1 | 3/2001 | Morris |
| 6,222,673 | B1 | 4/2001 | Austin |
| 6,299,338 | B1 | 10/2001 | Levinson |
| 6,304,584 | B1 | 10/2001 | Krupke |
| 6,350,041 | B1 * | 2/2002 | Tarsa et al. .................. 362/231 |
| 6,366,383 | B1 | 4/2002 | Roeder |
| 6,392,341 | B2 | 5/2002 | Jacobsen |
| 6,404,127 | B2 | 6/2002 | Jacobsen |
| 6,404,495 | B1 | 6/2002 | Melman |
| 6,529,322 | B1 | 3/2003 | Jones |
| 6,542,231 | B1 | 4/2003 | Garrett |
| 6,544,734 | B1 | 4/2003 | Briscoe |
| 6,594,075 | B1 | 7/2003 | Kanao et al. |
| 6,608,332 | B2 | 8/2003 | Shimizu |
| 6,614,161 | B1 | 9/2003 | Jacobsen |
| 6,637,905 | B1 | 10/2003 | Ng |
| 6,642,652 | B2 | 11/2003 | Collins |
| 6,649,432 | B1 | 11/2003 | Eilers |
| 6,674,575 | B1 | 1/2004 | Tandler et al. |
| 6,680,569 | B2 | 1/2004 | Mueller-Mach et al. |
| 6,690,467 | B1 | 2/2004 | Reel |
| 6,717,353 | B1 | 4/2004 | Mueller |
| 6,747,710 | B2 | 6/2004 | Hall |
| 6,791,629 | B2 | 9/2004 | Moskovich |
| 6,795,239 | B2 | 9/2004 | Tandler et al. |
| 6,843,590 | B2 | 1/2005 | Jones |
| 6,869,206 | B2 | 3/2005 | Zimmerman et al. |
| 6,870,165 | B2 | 3/2005 | Amirkhanian |
| 6,926,848 | B2 | 8/2005 | Le Mercier |
| 6,958,245 | B2 | 10/2005 | Seul et al. |
| 6,960,872 | B2 | 11/2005 | Beeson et al. |
| 6,981,970 | B2 | 1/2006 | Karni |
| 7,009,211 | B2 | 3/2006 | Eilers |
| 7,035,017 | B2 | 4/2006 | Tadic-Galeb |
| 7,083,610 | B1 | 8/2006 | Murray et al. |
| 7,186,005 | B2 * | 3/2007 | Hulse .......... 362/255 |
| 7,205,048 | B2 | 4/2007 | Naasani |
| 7,208,007 | B2 | 4/2007 | Nightingale et al. |
| 7,211,833 | B2 | 5/2007 | Slater, Jr et al. |
| 7,239,449 | B2 | 7/2007 | Leitel et al. |
| 7,264,366 | B2 * | 9/2007 | Hulse .......... 362/84 |
| 7,384,797 | B1 * | 6/2008 | Blair .......... 436/524 |
| 7,416,313 | B2 | 8/2008 | Westphal et al. |
| 2002/0127224 | A1 | 9/2002 | Chen |
| 2003/0198049 | A1 * | 10/2003 | Hulse et al. .......... 362/249 |
| 2003/0230728 | A1 | 12/2003 | Dai |
| 2003/0233138 | A1 | 12/2003 | Spooner |
| 2004/0090600 | A1 | 5/2004 | Blei |
| 2004/0247861 | A1 | 12/2004 | Naasani |
| 2005/0116635 | A1 | 6/2005 | Walson et al. |
| 2005/0152029 | A1 | 7/2005 | Endo |
| 2005/0184651 | A1 | 8/2005 | Cheng |
| 2005/0260676 | A1 * | 11/2005 | Chandler et al. .......... 435/6 |
| 2005/0263679 | A1 * | 12/2005 | Fan et al. .......... 250/214.1 |
| 2006/0030026 | A1 | 2/2006 | Garcia |
| 2006/0060872 | A1 | 3/2006 | Edmond et al. |
| 2006/0060879 | A1 | 3/2006 | Edmond |
| 2006/0114960 | A1 * | 6/2006 | Snee et al. .......... 372/67 |
| 2006/0170931 | A1 * | 8/2006 | Guo et al. .......... 356/480 |
| 2006/0237658 | A1 | 10/2006 | Waluszko |
| 2006/0282137 | A1 | 12/2006 | Nightingale et al. |
| 2007/0064202 | A1 | 3/2007 | Moffat et al. |
| 2007/0064409 | A1 * | 3/2007 | Hulse .......... 362/84 |
| 2007/0126017 | A1 | 6/2007 | Krames et al. |
| 2007/0133204 | A1 * | 6/2007 | Hulse et al. .......... 362/235 |
| 2007/0211460 | A1 | 9/2007 | Ravkin |
| 2007/0253733 | A1 | 11/2007 | Fey |
| 2007/0281322 | A1 | 12/2007 | Jaffe et al. |
| 2007/0284513 | A1 * | 12/2007 | Fan et al. .......... 250/216 |
| 2007/0297049 | A1 | 12/2007 | Schadwinkel et al. |
| 2008/0169746 | A1 * | 7/2008 | Hulse .......... 313/483 |
| 2008/0291446 | A1 * | 11/2008 | Smith et al. .......... 356/338 |
| 2009/0091915 | A1 * | 4/2009 | Eriksson .......... 362/84 |
| 2009/0134414 | A1 * | 5/2009 | Li et al. .......... 257/98 |

FOREIGN PATENT DOCUMENTS

| | | |
|---|---|---|
| EP | 1 426 807 | 12/2003 |
| GB | 0943756 | 12/1963 |
| GB | 2 000 173 A | 1/1979 |
| JP | 2005-243973 | 9/2005 |
| JP | 2006-049814 | 2/2006 |
| JP | 2007-133435 | 5/2007 |
| KR | 10-2006-0055934 | 5/2006 |
| WO | WO 2002/080577 | 10/2002 |

| | | |
|---|---|---|
| WO | WO 2006/067885 | 6/2006 |

OTHER PUBLICATIONS

Mauch, R.H., et al., "Optical Behaviour of Electroluminescent Devices," Springer Proceedings in Physics, vol. 38, Electroluminescence, © Springer-Verlag Berlin, Heidelberg, pp. 291-295 (1989).

Vlasenko, N.A., et al., "Interference of Luminescent Emission from an Evaporated Phosphor," Opt. Spect., vol. 11, pp. 216-219 (1961).

Vlasenko, N.A., et al., "Investigation of Interference Effects in Thin Electroluminescent ZnS-Mn Films," Opt. Spect., vol. 28, pp. 68-71 (1970).

Poelman, D., et al., "Spectral Shifts in Thin Film Electroluminescent Devices: An Interference Effect," J. Phys. D: Appl. Phys., vol. 25, pp. 1010-1013 (1992).

Tuenge, R.T., "Current Status of Color TFEL Phosphors," Electroluminescence—Proceedings of the Sixth International Workshop on Electroluminescence, El Paso, Tex., pp. 173-177, May 1992.

Plasma Display Manufacturers of the American Display Consortium, "Recommended Research Topics on Plasma Display for the DARPA Sponsored Phosphor Center of Excellence," pp. 1-2, Mar. 24, 1993.

Yamamoto, Y., et al., "Optical Processes in Microcavities," Physics Today, pp. 66-73, Jun. 1993.

E.F. Schubert, E.F., et al., "Giant Enhancement of Luminescence Intensity in Er-doped $Si/SiO_2$ Resonant Cavities," Appl. Phys. Lett. vol. 61, No. 12, pp. 1381-1383, Sep. 21, 1992.

Yokoyama, H., "Physics and Device Applications of Optical Microcavities," Science, vol. 256, pp. 66-70, Apr. 3, 1992.

Haroche, S., et al., "Cavity Quantum Electrodynamics," Scientific American, pp. 54-62, Apr. 1993.

Depp, S.W., et al., "Flat Panel Displays," Scientific American, pp. 90-97, Mar. 1993.

Huo, D.T.C., et al., "Reticulated Single-Crystal Luminescent Screen," J. Electrochem. Soc., vol. 133, No. 7, pp. 1492-1497, Jul. 1986.

Hinds, E.A., "Spectroscopy of Atoms in a Micron-Sized Cavity," (date and periodical title unknown), pp. 18-19.

Whitaker, Jerry C., "Electronic Displays: Technology, Design, and Applications," McGraw-Hill, Inc., pp. 185-192 (1994).

Hecht, Jeff, "Diverse fiberoptic systems require varied sources," Laser Focus World, vol. 36, No. 1, pp. 155-161, Jan. 2000.

Hamberg, I. and Granqvist, C.G., "Evaporated Sn-doped $In_2O_3$ films: Basic optical properties and applications to energy-efficient windows," Journal of Applied Physics, vol. 60, No. 11, pp. R123-R159, Dec. 1, 1986.

World Watch, Photonics Spectra, "IR Reflective Coating Boosts Bulb's Output, Recycling of IR Energy Saves Power, Cuts Costs" pp. 40-41, Jan. 1991.

Jenmar Visual Systems, Sunnyvale, CA, 4 pages, no date, but at least as early as Oct. 15, 1998.

DDS™ Rear Projection Screens, LORS™ Reflection Screens, ©1998 Physical Optics Corporation, Torrance, CA, 2 pages.

Schott Glass Technologies, Inc., Schott Total Customer Care, Contrast Enhancement Filters, Duryea, PA, 6 pages, Jan. 1998.

Handbook of Optics, vol. 1—Fundamentals, Techniques, and Design, Second Edition, Chapter 42: Optical Properties of Films and Coatings, J.A. Dobrowolski, pp. 42.3-42.25, McGraw-Hill, Inc., © 1995.

Young, L., "Multilayer Interference Filters with Narrow Stop Bands," Applied Optics, vol. 6, No. 2, pp. 297-312, Feb. 1967.

Hemingway, D.J. and Lissberger, P.H., "Effective Refractive Indices of Metal-Dielectric Interference Filters," Applied Optics, vol. 6, No. 3, pp. 471-476, Mar. 1967.

Holloway, R.J. And Lissberger, P.H., "The Design and Preparation of Induced Transmission Filters," Applied Optics, vol. 8, No. 3, pp. 653-660, Mar. 1969.

Landau, B.V. and Lissberger, P.H., "Theory of Induced-Transmission Filters in Terms of the Concept of Equivalent Layers," Journal of the Optical Society of America, vol. 62, No. 11, pp. 1258-1264, Nov. 1972.

Lissberger, P.H., "Coatings with Induced Transmission," Applied Optics, vol. 20, No. 1, pp. 95-103, Jan. 1, 1981.

Pelletier, E. and MacLeod, H.A., "Interference Filters with Multiple Peaks," Journal of the Optical Society of America, vol. 72, No. 6, pp. 683-687, Jun. 1982.

Da-Lite Screen Company, Inc., www.da-lite.com, 46 pages website downloads as of Oct. 8, 1998.

Stewart Filmscreen Corporation®, www.stewartfilm.com, 34 pages website downloads as of Oct. 8, 1998.

Albrecht, M., et al., "Scintillators and Wavelength Shifters for the Detection of Ionizing Radiation," Astroparticle, Particle and Space Physics, Detectors and Medical Physics Applications, ICATPP-8, M. Barone, et al., Eds, World Scientific, pp. 502-511 (2004).

Flor-Henry, M., et al., "Use of a Highly Sensitive Two-Dimensional Luminescence Imaging System to Monitor Endogenous Bioluminescence in Plant Leaves," BMC Plant Biology, vol. 4, No. 19, Nov. 2004.

* cited by examiner

LIGHT EMITTING DIODE ILLUMINATION SYSTEM

PRIORITY CLAIM

This application claims priority to: (1) U.S. Provisional Patent Application Ser. No. 60/947,938, entitled: "NOVEL LED ILLUMINATION SYSTEM", inventor: Arlie R. Conner, filed Jul. 3, 2007, which application is incorporated herein by reference in its entirety.

FIELD OF THE INVENTION

The present invention relates to using Light Emitting Diodes for illumination.

BACKGROUND OF THE INVENTION

Light Emitting Diodes (LEDs) are leading the way to greater efficacy as well as greater wall-plug efficiency.

SUMMARY

Embodiments of the present invention are directed to methods and devices for converting the output of a specific color LED and generating a broader band of wavelengths of emission including not only the specific color but additional color output. Specific embodiments, as will be described below, minimize backward directed light while increasing the total range of wavelengths emitted.

BRIEF DESCRIPTION OF THE DRAWINGS

This invention is described with respect to specific embodiments thereof. Additional features can be appreciated from the Figures in which.

DETAILED DESCRIPTION OF THE INVENTION

Figure 1:
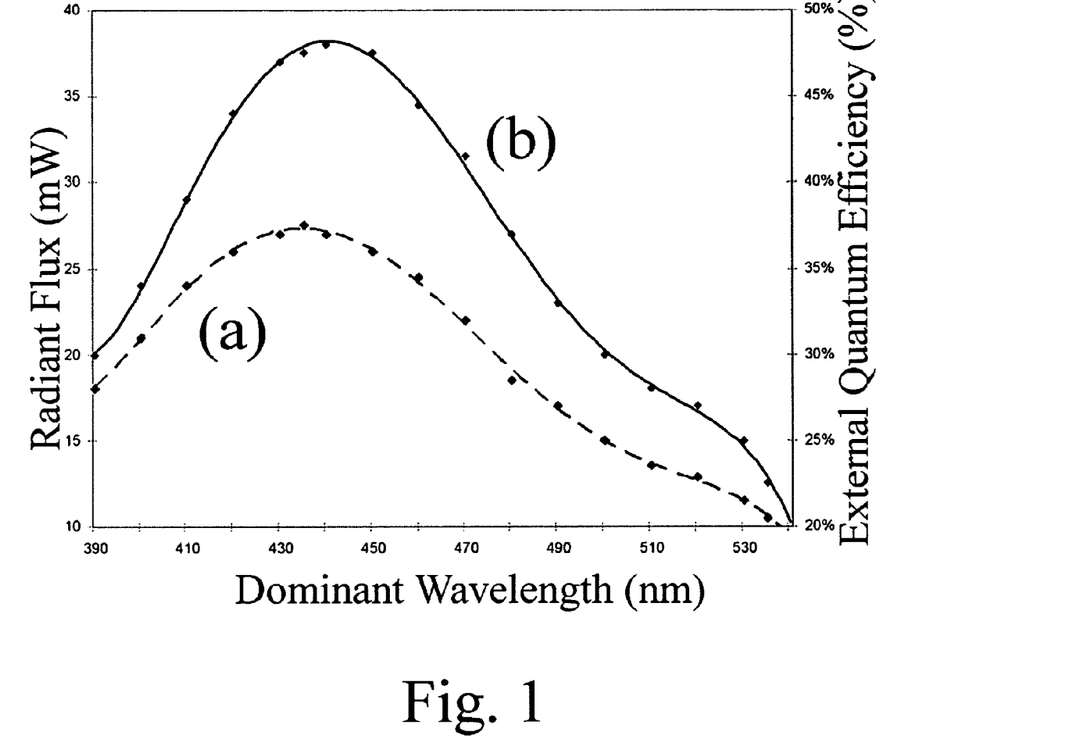
FIG. 1 shows the wavelength versus (a) radiant flux and (b) external quantum efficiency diagram for an InGaN LED.

Light emitting diodes are leading the way to greater efficacy as well as greater wallplug efficiency. For the InGaN approach, however, as more Indium is added to the GaN, overall efficiency drops steadily with increasing wavelength, as can be seen in FIG. 1, (see FIG. 7 of U.S. patent application Ser. No. 11/037,965 to Edmund, titled "High Output Small Area Group III Nitride LEDS", which patent application is herein expressly incorporated by reference in its entirety; see also U.S. Pat. No. 7,211,833 to Slater Jr. et al., titled "Light Emitting Diodes Including Barier Layers/Sublayers", which patent is herein expressly incorporated by reference in its entirety).

Figure 2:
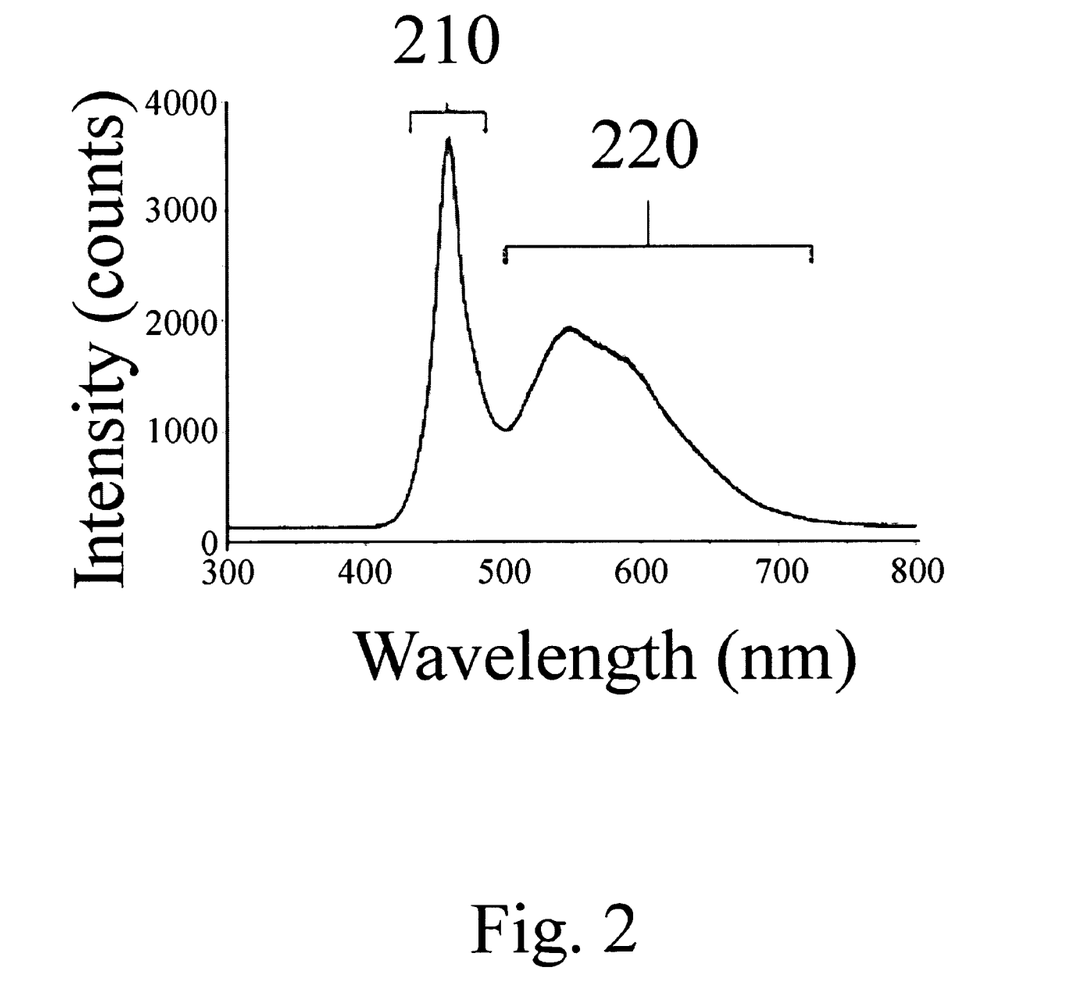
FIG. 2 shows a blue LED with yellow-green phosphor spectral graph.

So even though red LEDs and blue LEDs have achieved record wall-plug efficiencies, there is a dramatically reduced efficiency for green LEDs. Green LEDs are not used to make 'white' light due to this lower efficiency. Instead, the practical solution has been to use a phosphor, typically Ce doped YAG deposited directly on top of the blue LED to create a kind of white lighting element as shown in FIG. 2, where 210 indicates the flux intensity attributed to the blue LED (e.g., a GaN or InGaN LED) and 220 indicates the flux intensity attributed to the phosphor (e.g., Ce doped YAG). This has become quite effective, although color rendering is quite poor due to the phosphor having a broad yellow peak and falling off in the red region. The phosphor must be deposited in a fairly uniform thickness, generally embedded into a silicone matrix so that it stays in place but with the tradeoff being that if it becomes too thick it becomes an impediment to (its own emitted) light getting through. The function is preserved that blue light is absorbed and yellow light emitted but the back-emitted yellow light has trouble getting out of the package since it must be reflected from the LED itself and then subsequently must pass through the phosphor layer (which is dense and highly scattering).

Despite the difficulties of this method, it is very successful due to its simplicity compared to for example the use of separate red, green, (the green portion of the spectrum also includes yellow light) and blue LED elements combined to make an alternative 'white' lamp. A warm white' can be created with a loss of efficacy by adding a red phosphor to the yellow YAG:Ce phosphor and there are, an abundance of alternative phosphors to choose from.

A newer development that shows some promise is the development of an inexpensive solid crystal phosphor, offered by Nippon Sheet Glass and described in an article entitled "YAG glass-ceramic phosphor for white LED (I): background and development" by Fujita et al. published in connection with the Fifth International Conference on Solid State Lighting. Edited by Ferguson, Ian T. et al. in Proceedings of the SPIE, Volume 5941, pp. 186-192 (2005). The back-emitted light might get through the phosphor layer more easily since the phosphor layer is no longer scattering.

There are also proposed solutions that allow both hemispheres (i.e. the full spherical emission from a layer of phosphor) to escape, such as the work of Nadarajah Narendran and others at The Lighting Research Center (at Rensselaer Polytechnic Institute) as mentioned in an April 2005 article entitled "Remote phosphor technique improves white LED output" published online in LEDs Magazine at: http://www.ledsmagazine.com/news/2/4/22, and detailed in a white paper entitled Improved Performance White LED, published in 2005 in the Fifth International Conference on Solid State Lighting Proceedings of SPIE and available at: http://www.lrc.rpi.edu/programs/solidstate/pdf/narendranSPIE2005.pdf.

A dye, unlike an inorganic powder phosphor can be easily photo bleached. So that spreading a dye out, i.e., by having a larger surface area (or a larger volume) and having lower energy densities are requirements to make a dye system work. In contrast, an inorganic powder phosphor can be applied directly to the LED surface. Further, many inorganic powder phosphors are sufficiently robust to allow direct application to an intense light emitting surface (blue light and UV are more energetic also).

Dome Lens

Figure 3:
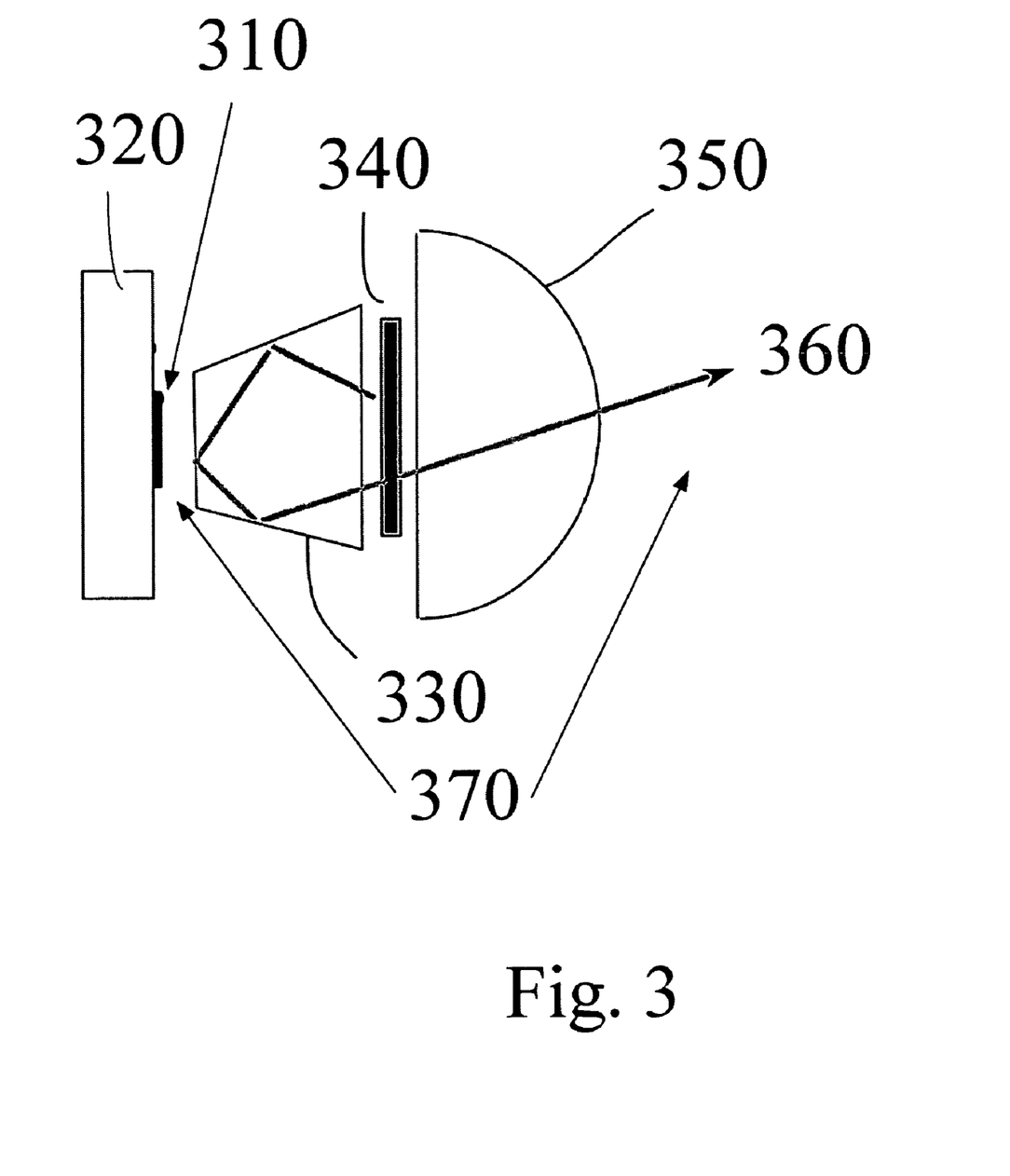
FIG. 3 shows light passing through a polymer dome lens, where backward directed light is redirected forward and transmits through the wavelength conversion layer containing a fluorescent dye according to an embodiment of the invention.

In an embodiment of the invention, a LED is placed at one end of a solid rectangular rod of high refractive index. All the light from the LED is captured by the input face of the rod and channeled to its output face. At the output face, a plastic or polymer sheet can be positioned that has a florescent dye embedded. The dye is preferably highly sensitive to the LED light and emits light of a longer wavelength with greater than 80% internal quantum efficiency. A dome lens or other "extracting" structure is positioned after the polymer (ideally optically coupled to it) so that the light emitted from the dyed polymer layer can escape into air in the forward hemisphere, as shown in FIG. 3. The light is emitted isotropically within the polymer medium (which is preferably polystyrene or polyvinyl toluene or poly methyl methacrylate). Consider the light that is emitted toward the back hemisphere, i.e., back into the high index rod. Total Internal Reflection (TIR) is effective at the sides of the rod, thus there is no light leaking out the side faces. The back side has a mirror coating, with an opening for the LED light to enter and the ideal size of the rod is governed by cost considerations but with the understanding that the larger the relative size of rod to the LED area, the more efficiency expected.

In contradistinction to the work of Narendran et al., in various embodiments of the invention, the back emitted light reflects from within the secondary optic (i.e., solid rod or prism) and can be redirected toward the light-conversion medium, through which it can be nearly completely transmitted. Although this same approach might be used with a powder phosphor, a sufficient layer thickness of such phosphor will not effectively allow high transmission for this redirected light and the overall efficiency will suffer badly.

With respect to FIG. 3, the LED 310 is mounted on a metal core board 320 with a rectangular or pyramid-shaped (glass prism optic) 330 which serves to redirect the backward directed light that is generated from within the wavelength converting polymer layer 340, to a forward lighting direction 360. After passing substantially unimpeded and without scatter, through the dyed polymer 340, it can then exit into air 370 being assisted by a final exterior optic such as a dome lens 350 (hemispherical—made of plastic, glass or a cured polymer such as silicone).

Figure 4:
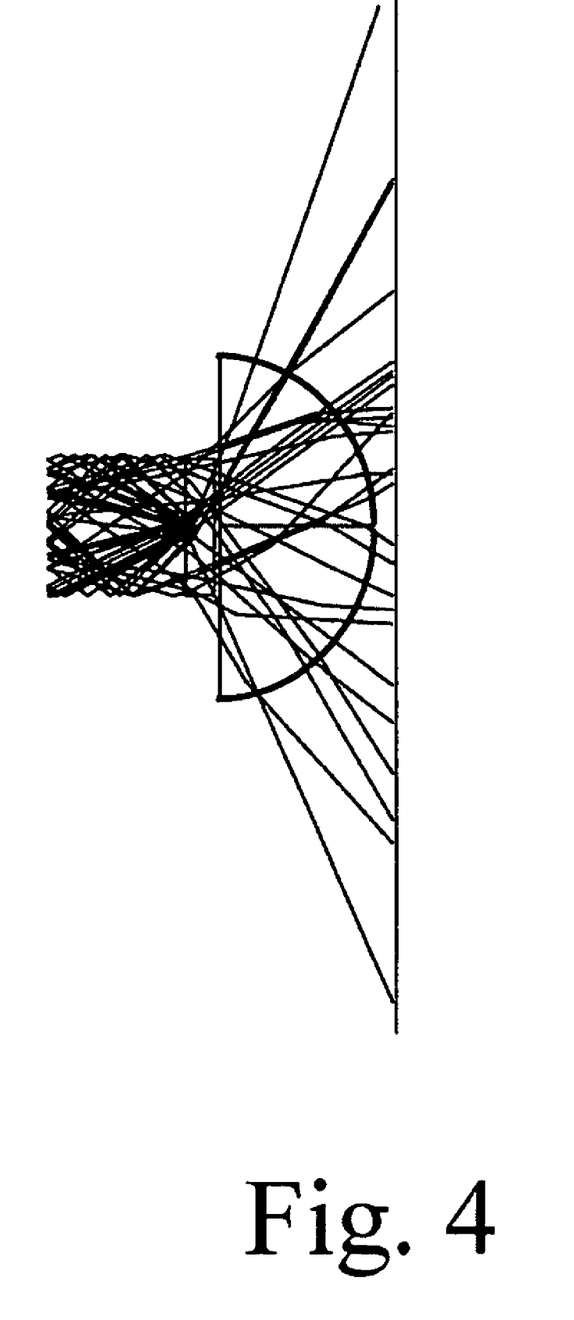
FIG. 4 shows a ray-tracing computer simulation graph based on the set-up in FIG. 3.

With a 1×1 mm LED size, an 8×8×8 mm prism is placed nearly touching the LED surface. At the input face is applied a mirror except for the 1×1 mm input aperture. In this case greater than 99% of the back-emitted light from the polymer is redirected to the front hemisphere and escapes as useful illumination, as illustrated in FIG. 4.

Shrinking the rod to 5×5×5 mm dimension results in the forward efficiency decreasing by only about 1%. Many of the rays that strike the input surface at the LED aperture are of sufficiently high angle that they are totally internally reflected, so that this aperture need not be as small as possible. The manufacturing tolerances are thus reduced.

With a larger (air) spacing from the LED to the rod, a larger opening in the mirrorized front face of the rod can be considered. For a 6×6×6 mm rod with an input face having a 2×2 mm clear aperture, the efficiency of reflecting the back-emitted light (redirected forward and escaping into the dome optic) is 96%.

In an alternative embodiment of the invention, the prism can be a hollow mirror cavity. In another embodiment of the invention, a front surface mirror with air cavity between it and the polymer layer, and the mirror cavity having a hole or transparent segment such that the blue light goes through the mirror cavity.

Color Mixing

In an embodiment of the invention, a dome lens affords a simple and low cost means of adding a fluorescent medium to an LED to change the color of the emitted radiation.

There are certain dyes that are mixed into polymers for scintillator applications that can convert blue light to green, orange and red wavelengths. These so-called Wavelength Shifting Fibers are made from dyed polystyrene, but the same dyes might also be mixed into acrylic or polyvinyltoluene or any other suitable plastic. Such dyes might also be mixed with an epoxy or silicone resin, and used as part of an optical adhesive. Furthermore, these dyes can be combined to create a yellowish output light—in any chosen ratio or concentration. By choosing the ideal concentration just 30% of the LED blue light can be absorbed and 70% converted to green and red wavelengths, thereby making a 'white' light or an RGB lighting system, with output spectral characteristics as desired given the dye emission spectral characteristics and the LED spectrum (and the adjusted ratio there between).

In an embodiment of the invention, a multicolor LED based lighting element includes a LED light source, wherein the LED light source emits LED light of at least a selected color, a fluorescent dye positioned to receive the LED light, wherein the LED light passing through the fluorescent dye emits fluorescent light of one or more colors other than the selected color, wherein the fluorescent light is being emitted in the forward direction and in a backward direction and an optical element positioned between the LED light source and the fluorescent dye to redirect fluorescent light emitted from the backward direction into the forward direction.

Figure 5:
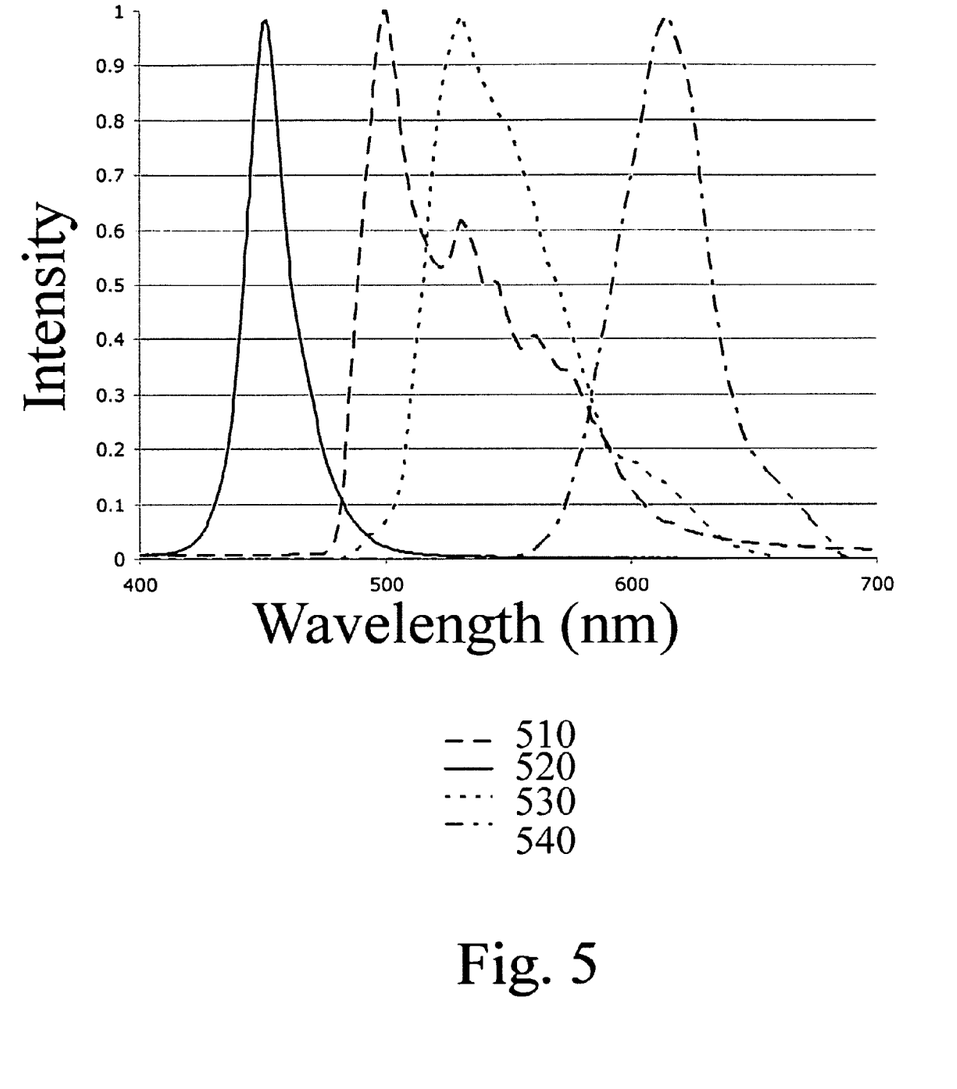
FIG. 5 shows the output wavelength luminance of Kuraray Y-11 (K-27 dye), Cree Blue LED, St. Gobain BCF-60 and Kuraray R-3 dyes.

FIG. 5 shows the output luminance intensity versus wavelength for Kuraray Y-11 (K27 dye) 510, BCF-60, 530, and Kuraray R-3, 540 as well as a Cree blue LED 520, for reference. The available dyes cover the visible spectrum and can be easily mixed in any desired ratio and such formula is highly repeatable so that a particular color balance can be readily achieved in a production environment. Makers of dyed polymer offer standard products, including Kuraray of Tokyo, Japan, St. Gobain Crystals (formerly Bicron) of Newbury, Ohio, Eljen Technology of Sweetwater, Tex. and NanOptics of Gainsville, Fla. Generally the market demand is for scintillator applications and the polymer is produced as a 'wavelength shifting' fiber optic light guide.

Figure 6:
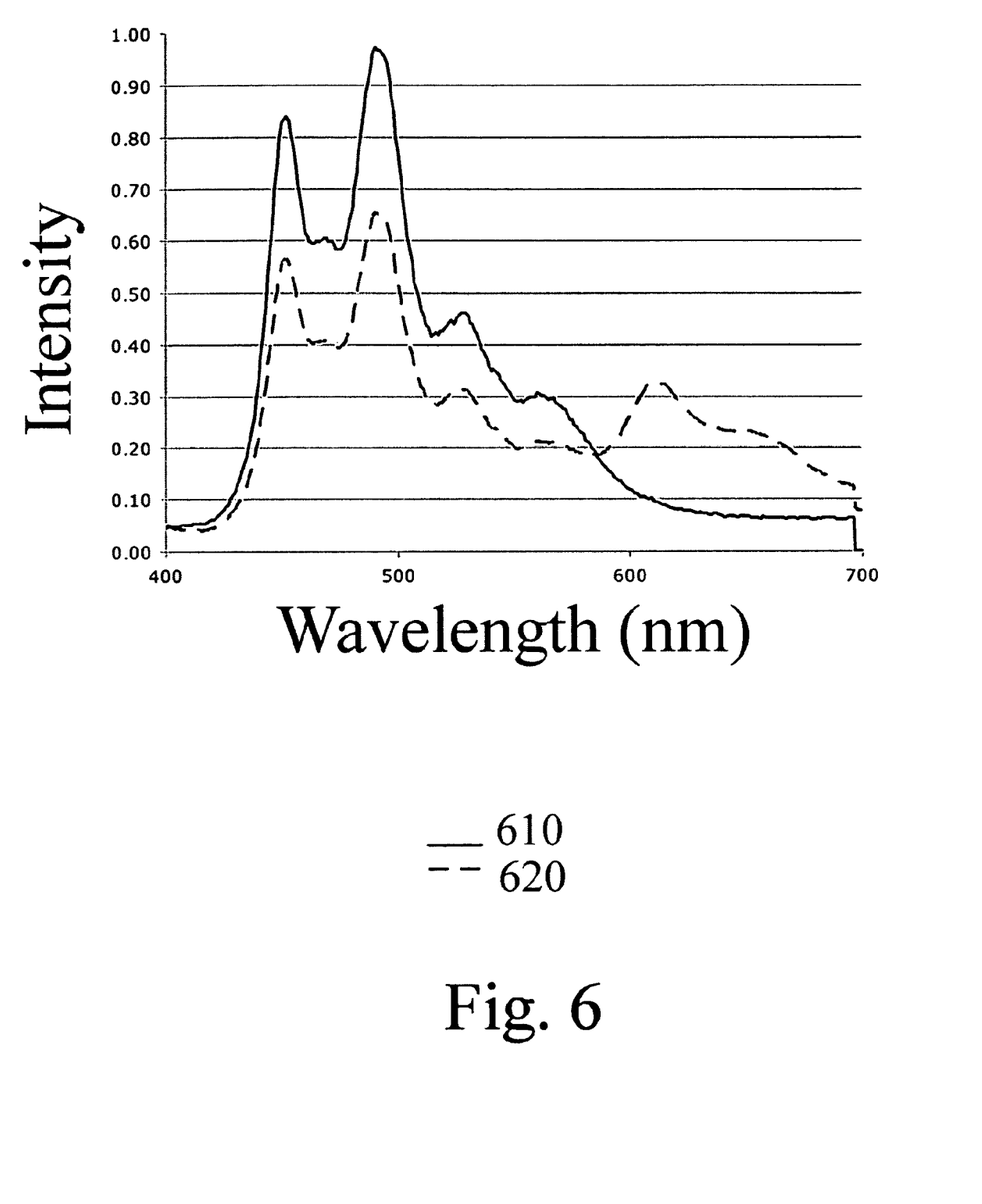
FIG. 6 shows a graph of the emission wavelength of a combination of the blue LED passed through a green dye layer and the blue LED passed through green and red dye layers.

By adding the yellow-green emitted color from the dyed polymer to a pure blue LED a kind of white LED can be created. Furthermore by adding a red dye to the polymer, or by stacking a red dyed polymer on top of a green dyed polymer, a color balanced 'white' light system can be synthesized. FIG. 6 shows a graph of the emission wavelength of a combination of the blue LED and green dye 610 or the blue LED with green and red dye 620 (effected using a blue LED with the emission passing through one or both (or a plurality of) dyed layers. The curve 620 has a 'white point' at CIE (International Commission on Illumination) x, y=0.30, 0.30 which is very close to the D65 lighting standard (x=0.3127, y=0.3291). This color would be viewed as a high quality white by a human observer.

Because the dyed polymer (green in the following example) is quite transparent to the longer wavelengths (not absorbing), in an embodiment of the invention, red light can be added by means of red LEDs placed near the blue LED and emitting at least partly through the dyed layer, combining spatially with the blue LED emission and the green dye emission to get a different quality of white (it should be pointed out that any of these spectra are quite acceptable for general lighting, reading and other task lighting, and perhaps superior to a YAG:Ce phosphor based 'white' LED). Addition of red wavelengths would be considered desirable to improve the quality of the color rendering of the light source.

ALTERNATIVE EMBODIMENTS

In an alternative embodiment of the invention, a lower cost rod optic is desired and TIR is not considered useful, any plastic or glass might be used and the sides coated with aluminum or silver or a dielectric mirror, so as to make this same vessel as reflective as possible. The efficiency will be somewhat reduced due to the lower effective reflectance of the mirrored surfaces (TIR is nearly perfectly reflecting but a metallic reflector will be limited to 98% (enhanced Ag or Al) and such metallic mirrors might typically reflect only 90%. Because there is no need to reflect the blue light from the LED there is less concern about the loss of reflectivity for blue wavelengths and this mirror can be made less costly, i.e. a simple aluminized coating may suffice and show reasonably high reflection for the dye emission wavelengths.

In an embodiment of the invention, a BK7 rod and dyed PMMA (nearly index matched) can obtain around 70% efficiency for the back-directed hemisphere. The front-ward directed emission is effectively emitted with 100% efficiency, except for the fresnel reflection that is endemic to the hemispheric optic. Preferably an Anti-Reflective (AR) coating is applied to the emitting surface so that the total light escaping is increased and the surface reflection is less than 1%.

Because the polymer-dyes can be chosen from those having very high internal quantum efficiency, the total system efficacy can be nearly as high as the LED wall-plug efficiency. The Stoke's deficit is the only fundamental loss. For blue light shifted to green, the Stoke's deficit is on the order of 15% of the quantity of blue that is otherwise converted, the dyestuff is otherwise highly (90%) efficient at conversion, with the blue LEDs having wall-plug efficiencies of 30 to 50%. More specifically, a blue LED may have a wall plug efficiency (WPE) of about 45%. Polymer dyes can have conversion efficiencies of about 85% for Stoke's shift (on average) and an internal quantum efficiency of more than 85%, giving a total conversion efficiency of at least 72% and a resulting overall WPE green efficiency of about 32.5%.

For 530 nm green emission, 588 lumens/watt (L/W) are generated, as calculated directly from the CIE Y value. Effective conversion (note: the calculation ignores any fresnel surface losses) can yield an ideal best case 190 L/W for the green light. In an embodiment of the invention, using just 70% of the blue to convert to green light (i.e. allowing 30% of the blue LED light to pass unabsorbed through the dye layer and polymer), and starting with a 1 W blue LED, 42 L of blue light are generated (assuming 460 nm peak) at 30%=12 L, combined with 70% of the 190 L for green, to give a final total of 145 L of combined blue and green light. Additional Red LEDs can be placed alongside the blue LED to pass through the dye layer and be mixed with the combined blue and green light to make white light. With an assumed efficiency of 40% and 300 L/W for 610 nm (red) light, the resulting efficacy for red is 120 L/W.

As a result, an RGYB system using a 0.5 W red LED along with a 1 W blue LED (overall 1.5 W) along with a yellow-green dye conversion material would generate 200 lumens of RGB (nominal white) illumination, or 133 L/W. In contrast, an incandescent light produces only 15 L/W, and a compact fluorescent produces about 50 lumens per watt (http://hes.1-bl.gov/hes/makingithappen/nrr.html, last visited Jun. 30, 2008).

Figure 7:
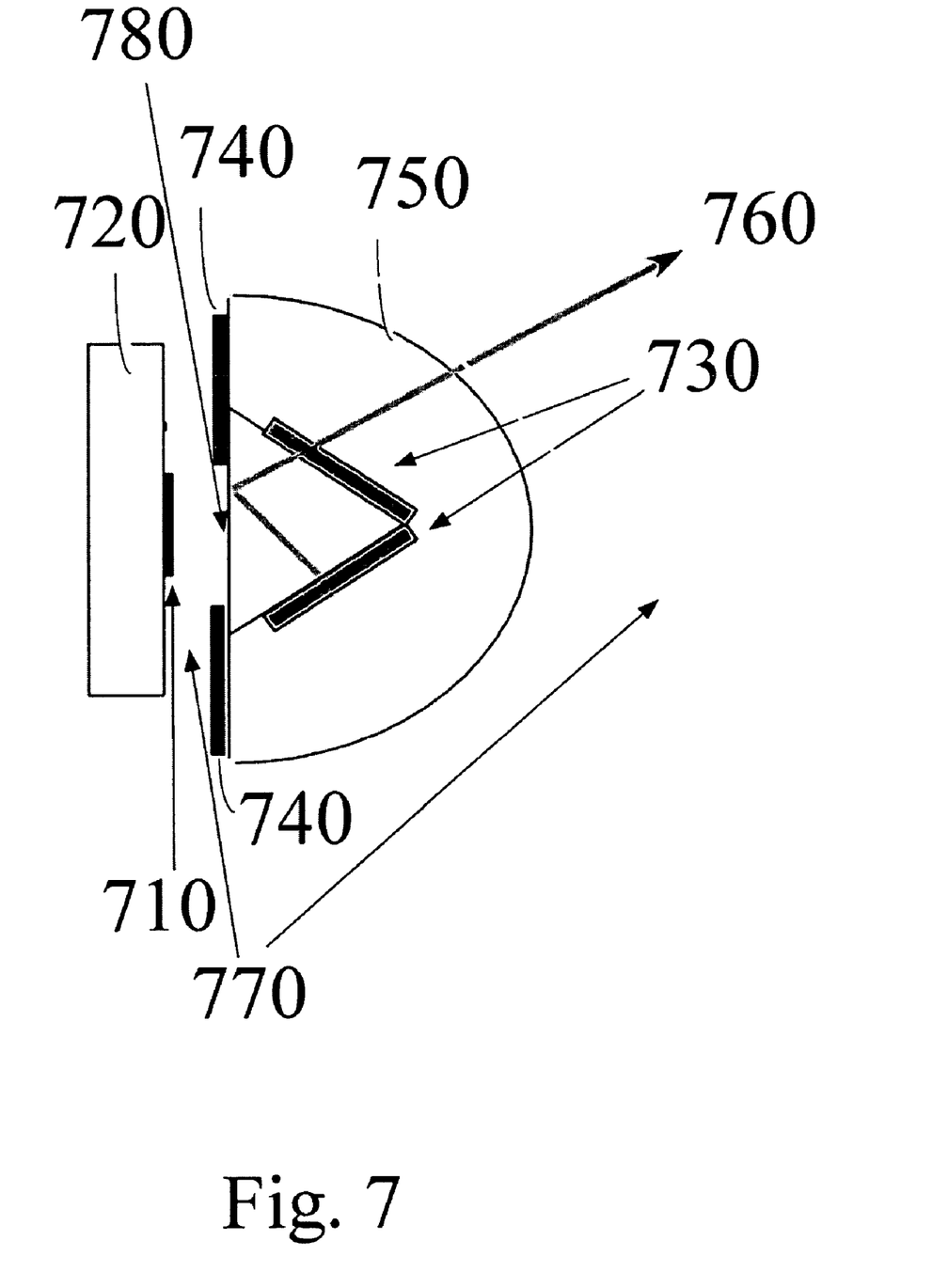
FIG. 7 shows an alternative embodiment of the invention, where a pyramid shaped high index prism is placed on top of the LED dye with a small air gap.

In another embodiment of the invention, this approach can create an effective red, green and blue (RGB) lighting element. In backlighting of an LCD for example there is a better transmission rate (i.e. higher brightness result) if the lamp is 'peaked' with red, green and blue wavebands so as to transmit better through the red, green and blue color filter matrix. Such an RGB lamp can be >50% more effective as a backlighting element compared to a Ce:YAG white LED and the resulting color gamut of the display system will be improved quite a bit due to this peaking at the same time. In an alternative embodiment of the invention, a pyramid shaped high index prism can be placed on top of the LED die, with a small air gap. As shown in FIG. 7, one or more LED 710 are mounted on a metal core board 720 separated from the pyramid shaped prism 750 and on top of each of the four faces of the prism is formed or added a layer of dyed polymer 730. The backward-emitted light is reflected at the glass-air interface 780 by means of TIR and redirected outward 760, back through the polymer 730 and into a final dome optic or lens 750 where it escapes into air 770. As before the light from the LED is unimpeded as it enters the higher index prism and all of the light should be able to be captured and introduced into the dyed polymer. In an alternative embodiment of the invention, a mirror 740 is added to the back of the prism to further enhance the reflection of light emitted in the backward direction by the dyed polymer. In an embodiment of the invention, the mirror can cover the back of the dome lens. The mirror may be a dichroic interference filter, designed so that LED (e.g., blue) light can pass through it but dyed polymer emitted light (e.g., yellow-green) can be reflected. Alternatively this mirror can be a simple metallic reflector (e.g., Aluminum or Silver) and selectively added so as not to block the center of the prism where the LED light is introduced into the optical structure.

Figure 8:
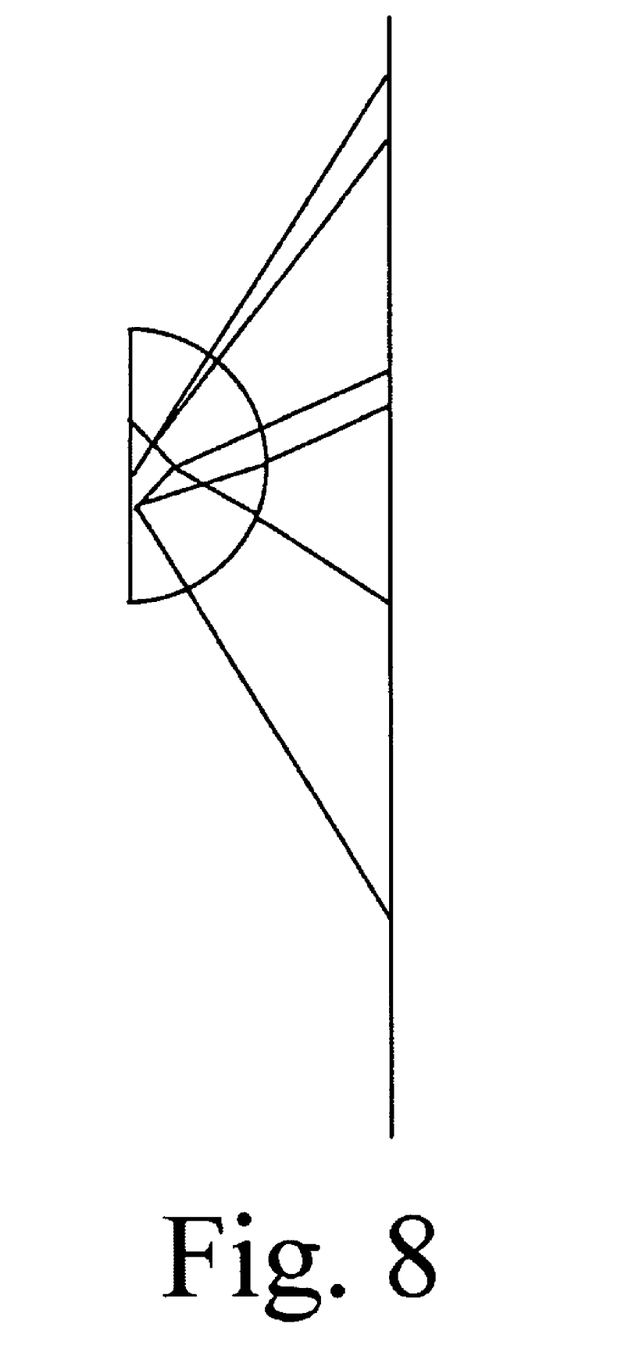
FIG. 8 shows a ray-trace of the trajectories of 6 rays based on an embodiment of the invention shown in FIG. 7, where the rays are launched from within the polymer and escape forward.
Figure 9:
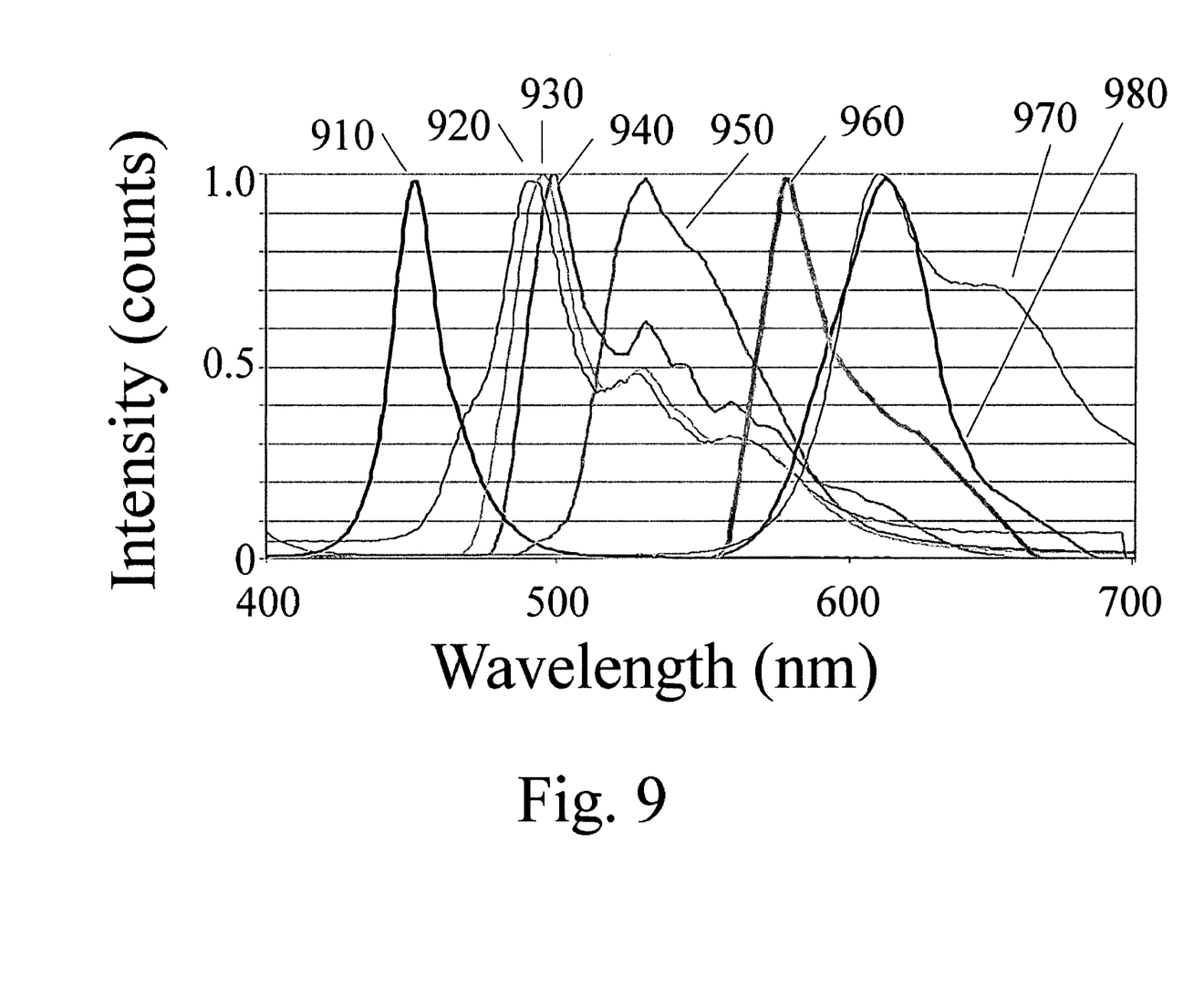
FIG. 9 shows the output wavelength luminance of Cree Blue LED; Eljen 20 ppm; Kuraray Y-11 (K27 dye); Kuraray 0-3; Kuraray R-3; Eljen EJ-280, St. Gobain BCF-60; and Eljen EJ-284 (500 ppm) dyes.

In FIG. 8 shows a ray-trace of 6 rays launched from within the polymer and escaping forward. In various embodiments of the invention, some of the available dyes and their spectral emissions are shown in FIG. 9, including Cree Blue LED 910; Eljen 20 ppm 920, EJ-284 (500 ppm) 930; Kuraray Y-11 (K27 dye) 940; BCF-60 950; Kuraray 0-3 960; Kuraray R-3 970 and EJ-280 980.

In an embodiment of the invention, a multicolor LED based lighting element, comprises a LED light source, wherein the LED light source emits LED light consisting of one or more selected color, a fluorescent dye positioned to receive the LED light, wherein the LED light passing through the fluorescent dye emits fluorescent light of one or more colors other than the selected color, wherein the fluorescent light is emitted in a forward direction and in a backward direction and an optical element positioned between the LED light source and the fluorescent dye to redirect fluorescent light from the backward direction into the forward direction. In an alternative embodiment of the invention the LED light passes through a plurality of fluorescent dyes emitting fluorescent light of one or more colors other than (i.e., in addition to) the selected color.

In an embodiment of the invention, the emitted light from a LED with a dye containing polymer coating can be directed onto an analyte. An analyte is one or more molecule or one or more atom alone or dissolved, suspended or dispersed in a medium. The analyte can be contained in a well, microcuvette, a micro-titer plate, a micro-array chip, a capillary, a tube, a pore, a sensor and a fluidic chip.

In an embodiment of the invention, a system for identifying a characteristic of one or more analyte comprises applying a potential to a LED to generate LED light in at least a selected color, positioning a fluorescent dye to receive the LED light, wherein the LED light passing through the fluorescent dye emits fluorescent light of one or more colors other than the selected color, wherein the fluorescent light is being emitted in the forward direction and in a backward direction, directing the forward emitted fluorescent light onto one or more analyte, wherein the one or more analyte emits light, directing the emitted light onto one or more light detector and identifying a characteristic of the one or more analyte based on the emitted light. In various embodiments of the invention, the emitted light can be detected based on one or more properties of the light emitted selected from the group consisting of fluorescence, phosphorescence, absorbance, transmittance, scattering and luminescence.

It will be appreciated that the entire visible spectrum can be covered with a handful of selected dyes.

Thus, the breadth and scope of the present invention should not be limited by any of the above-described exemplary embodiments, but should be defined only in accordance with the following claims and their equivalents.

A multicolor Light Emitting Diode (LED) based lighting element, comprising a LED light source, wherein the LED light source emits LED light consisting of one or more selected color. A fluorescent dye positioned to receive the LED light, wherein the LED light passing through the fluorescent dye emits fluorescent light of one or more colors other than the selected color, wherein the fluorescent light is emitted in a forward direction and in a backward direction, wherein the fluorescent dye is contained in a polymer. An optical element positioned between the LED light source and the fluorescent dye to redirect fluorescent light from the backward direction into the forward direction and a space between the polymer layer and the LED.

What is claimed is:

1. A multicolor Light Emitting Diode (LED) based lighting element for constituting a white light, comprising:
    a LED light source, wherein the LED light source emits LED light consisting of one or more selected color;
    a fluorescent dye positioned to receive the LED light, wherein the LED light passing through the fluorescent dye emits fluorescent light of one or more colors other than the selected color, wherein the fluorescent dye is generally transparent to the fluorescent light emitted; and
    wherein the fluorescent light is emitted in a forward direction and in a backward direction; and
    an optical element positioned between the LED light source and the fluorescent dye to redirect fluorescent light from the backward direction into the forward direction, wherein the fluorescent light emitted constitutes white light.

2. The lighting element of claim 1, wherein the LED light is emitted in a forward direction.

3. The lighting element of claim 1, wherein a plurality of LED light sources emit LED light.

4. The lighting element of claim 1, wherein the LED light passes through a plurality of fluorescent dyes emitting fluorescent light of one or more colors other than the selected color.

5. The lighting element of claim 1, wherein two or more LEDs each emit LED light wherein two or more fluorescent dyes are positioned to receive the LED light.

6. The lighting element of claim 1, wherein the fluorescent dye is contained in a polymer.

7. The lighting element of claim 6, wherein the polymer is generally transparent to the fluorescent light emitted.

8. The lighting element of claim 6, wherein the polymer is selected from the group consisting of polystyrene, polyvinyl toluene and poly methyl methacrylate or copolymer combinations thereof.

9. The lighting element of claim 6, further comprising an extracting optical element for directing light emitted in the forward direction from the polymer.

10. The lighting element of claim 6, further comprising a space between the polymer and the LED.

11. The lighting element of claim 6, wherein the polymer is a polymer layer.

12. The lighting element of claim 1, wherein a polymer is positioned between one or both the light source and the fluorescent dye, and the optical element and the fluorescent dye.

13. The lighting element of claim 12, wherein the polymer is a polymer film applied to one or both the light source and the optical element.

14. A method of generating a Red Green Blue (RGB) lighting system using a Light Emitting Diode (LED) based lighting element, comprising the steps of:
    applying a potential to a LED to generate LED light in at least a selected color;
    positioning a fluorescent dye to receive the LED light, wherein the LED light passing through the fluorescent dye emits fluorescent light of one or more colors other than the selected color, wherein the fluorescent dye is generally transparent to the fluorescent light emitted; and
    wherein the fluorescent light is being emitted in the forward direction and in a backward direction; and
    redirecting the backward emitted fluorescent light in the forward direction via an optical element positioned between the LED light source and the fluorescent dye, wherein the emitted fluorescent light comprises RGB light.

15. The method of claim 14, wherein the LED light is emitted in a forward direction.

16. The method of claim 14, wherein the fluorescent dye is contained in a polymer.

17. The method of claim 16, wherein the polymer is generally transparent to the fluorescent light emitted.

18. The method of claim 16, wherein the polymer is selected from the group consisting of polystyrene, polyvinyl toluene and poly methyl methacrylate or combinations thereof.

19. The method of claim 16, further comprising directing light emitted in the forward direction from the polymer via an extracting optical element.

20. A multicolor Light Emitting Diode (LED) based lighting element for constituting a white light, comprising:
    a LED light source, wherein the LED light source emits LED light consisting of one or more selected color;
    a fluorescent dye positioned to receive the LED light, wherein the LED light passing through the fluorescent dye emits fluorescent light of one or more colors other than the selected color, wherein the fluorescent dye is generally transparent to the fluorescent light emitted, and wherein there is a space between the fluorescent dye and the LED;

wherein the fluorescent light is emitted in a forward direction and in a backward direction; and an optical element positioned in the space between the LED light source and the fluorescent dye to redirect fluorescent light from the backward direction into the forward direction, wherein the fluorescent light emitted constitutes white light.

21. A method of generating a Red Green Blue (RGB) lighting system using a Light Emitting Diode (LED) based lighting element, comprising the steps of:

applying a potential to a LED to generate LED light in at least a selected color;

positioning a fluorescent dye to receive the LED light, wherein the LED light passing through the fluorescent dye emits fluorescent light of one or more colors other than the selected color, wherein the fluorescent dye is generally transparent to the fluorescent light emitted, and wherein there is a space between the fluorescent dye and the LED;

wherein the fluorescent light is being emitted in the forward direction and in a backward direction; and redirecting the backward emitted fluorescent light in the forward direction via an optical element positioned in the space between the LED light source and the fluorescent dye, wherein the emitted fluorescent light comprises RGB light.

* * * * *